United States Patent

Shimatsu

[11] 4,080,696
[45] Mar. 28, 1978

[54] METHOD OF MAKING PIEZOELECTRIC VIBRATOR

[75] Inventor: Hironori Shimatsu, Tokyo, Japan

[73] Assignee: Kabushiki Kaisha Daini Seikosha, Japan

[21] Appl. No.: 763,711

[22] Filed: Jan. 28, 1977

[30] Foreign Application Priority Data

Jan. 29, 1976    Japan ................................ 51-8632

[51] Int. Cl.² ........................................ H01L 41/22
[52] U.S. Cl. .............................. 29/25.35; 58/23 TF
[58] Field of Search .................... 29/25.35; 58/23 TF; 310/8.2

[56] References Cited

U.S. PATENT DOCUMENTS

| | | | |
|---|---|---|---|
| 3,683,213 | 8/1972 | Standte | 58/23 TF X |
| 3,691,720 | 9/1972 | Anderson et al. | 29/25.35 X |
| 3,914,836 | 10/1975 | Hafner et al. | 29/25.35 |

*Primary Examiner*—Carl E. Hall
*Attorney, Agent, or Firm*—Robert E. Burns; Emmanuel J. Lobato; Bruce L. Adams

[57] ABSTRACT

A piezoelectric vibrator element is shaped by photo-etching techniques from a quartz crystal wafer. Film electrodes and masses for frequency adjustment are applied by first depositing a layer of chromium and then a layer of gold on the element by vacuum depositing or sputtering. The element is then kept in a high vacuum of at least $10^{-5}$ torr and at a high temperature of 300° C to fix the depositions on the element and eliminate distortion. To adjust the frequency, a portion of the metal mass is removed by a laser beam, after which the element is kept in a high vacuum at high temperature to affix securely to the element any bits of metal that may have condensed during the removing step.

4 Claims, 6 Drawing Figures

METHOD OF MAKING PIEZOELECTRIC VIBRATOR

FIELD OF INVENTION

The present invention relates to piezoelectric vibrators for use in electronic devices for example, electronic watches, and to a method of making such vibrators.

BACKGROUND OF THE INVENTION

Piezoelectric vibrators especially quartz crystal vibrators for electronic watches should be made small in size and must work with small power consumption.

Conventionally quartz crystal vibrators of this kind are made by photo etching techniques. There are some defects resulting from photo etching such as high equivalent resistance resulting from distortion which accrues during the etching treatment and weak adherence of film electrodes and masses for frequency adjustment which are deposited on the surface of the vibrator. The resonant frequency of such vibrators is adjusted by removing a portion of the metal mass by laser evaporation. Since evaporated metal particles are apt to adhere on the surface of the vibrator again, the resonant frequency of the vibrator is apt to shift when such metal particles are subsequently dislodged by shock.

SUMMARY OF THE INVENTION

It is an object of the invention to overcome the disadvantages and insufficiencies of the prior art and to provide a piezoelectric vibrator having low equivalent resistance and having strong adherence between electrodes and the surface of the vibrator.

In accordance with the invention, distortion of the vibrator may be eliminated by keeping the vibrator in a high vacuum at high temperature. Electrodes and masses for frequency adjustment are made by depositing on the electrode surface, for example, by vacuum evaporation or sputtering a double layer metal film, for example, chromium and gold. Since the gold layer is fixed to the surface of the vibrator element by an intervening chromium layer, electrodes and frequency adjustment masses do not easily peel off from the surface of the vibrator. This is because the chromium layer is strongly fixed to the surface of the quartz crystal and is also strongly fixed to the gold layer by mutual diffusion or precipitation between the two metal layers. Moreover, after removal of a portion of the metal mass for frequency adjustment, for example with a laser beam, the vibrator is kept in a high vacuum at a high temperature for a time sufficient to affix securely to the vibrator any particles of metal that may have condensed on the vibrator surface during the frequency adjusting step.

BRIEF DESCRIPTION OF DRAWINGS

The nature, objects and advantages of the invention will be more fully understood from the following description of a preferred embodiment illustrated by way of example in the accompanying drawings in which.

DESCRIPTION OF PREFERRED EMBODIMENT

Figure 1:
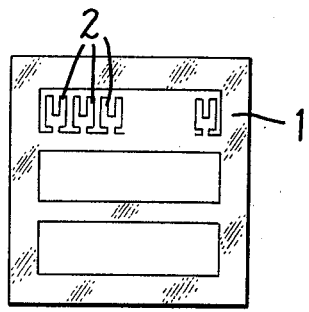
FIG. 1 shows schematically a plurality of tuning forks which are made on a sheet of quartz crystal wafer by photo-etching technique.

With reference to the accompanying drawings, FIG. 1 shows a plurality of vibrator elements in the shape of tuning forks 2 which are made at the same time on a sheet of quartz crystal wafer 1 by photo-etching technique; such elements being shown on only a part of the sheet. After this photo-etching treatment, film electrodes 3 and masses 4 for frequency adjustment are deposited on one or both surfaces of each vibrator 2, for example by vacuum evporation or sputtering. The film electrodes 3 and masses for frequency adjustment consist of a chromium layer 3a and an overlying gold layer 3b which are deposited on the surface of the vibrator at the same time or separately.

After the electrodes and frequency adjustment masses have been applied, the vibrators are kept in a high vacuum at a high temperature for a predetermined period of time to eliminate distortion of the vibrators and to affix the metal layers securely to the surface of the vibrators. In the illustrated embodiment of the invention the vacuum is at least $10^{-5}$ Torr. The temperature is of the order of 300° C and the holding time is sufficient to eliminate distortion resulting from the etching process in making the vibrators and distortion resulting from deposition of the metal layers by vacuum evaporation or sputtering. As an example, the time of treatment is about 5 hours beginning when the vacuum is about $10^{-5}$ Torr. After the elapse of a certain time the vacuum is increased to $10^{-6}$ Torr.

Figure 3:
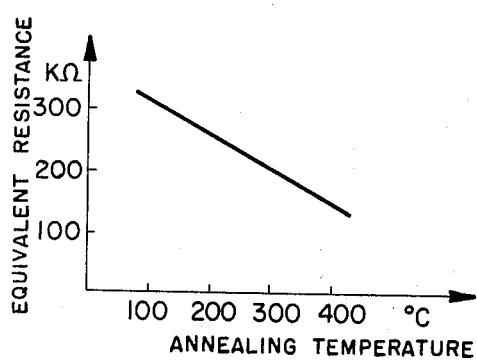
FIG. 3 is a curve showing the relationship between equivalent resistance of the vibrator and the annealing temperature.

The value of the equivalent resistance is decreased to almost half of that when the vibrators are not subjected to the distortion eliminating treatment. As shown in FIG. 3, equivalent resistance decreases when the annealing temperature increases. In case the equivalent resistance decreases and the oscillating frequency is constant, equivalent inductance, capacitance between electrodes and series capacitance of the equivalent circuit (not shown) of the vibrator do not affect power consumption of the oscillator circuit. Power consumption of the oscillator circuit increases in proportion to the value of the equivalent resistance. When a vibrator which was treated by the above mentioned process is incorporated in an electronic watch, the battery life of the watch will be increased.

Figure 2:
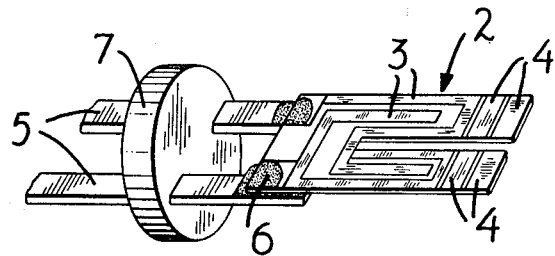
FIG. 2 is an enlarged perspective view showing a quartz crystal vibrator mounted on a pedestal of the casing.

FIG. 2 is a schematic perspective view showing the state in which a quartz crystal vibrator 2 is mounted on a pedestal 7 which is fixed to a casing (not shown) in which the vibrator is sealed. The base portion of the vibrator 2 is fixed by adhesive agent 6 to electrical conductors 5 which act as lead wires and also as a support for the vibrator element. The resonant frequency of the vibrator is adjusted by evaporating portions of film weights 4 by means of a laser beam.

Figure 4:
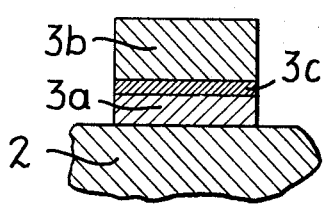
FIG. 4 is an enlarged schematic cross-sectional view showing the structure of a metal electrode fixed to the surface of the vibrator.

It is desirable to keep the vibrators in a high vacuum and at a high temperature after the above mentioned frequency adjustment has been effected. In this case, distortion which may appear near the mounting portions of the vibrator can be eliminated. By keeping the vibrator in a high vacuum at high temperature the coherence between metal and metal and between metal and the piezoelectro crystal, for example, quartz crystal, it strengthened by migration of molecules of the materials. As shown schematically in FIG. 4 since the chromium layer 3a is diffused into the gold layer 3b and gold is diffused into the chromium layer a mutual diffusion layer 3c appears between the two layers 3a and 3b and the electrode 3 is strongly fixed to the surface of the vibrator 2.

Figure 5:
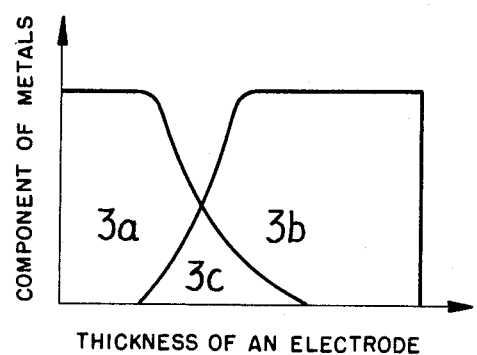
FIG. 5 is a curve showing the distribution of the two metals in the composite layer in the direction of the thickness of the electrode and FIG. 6 is an enlarged schematic cross-section illustrating particles of metal condensed on a surface of the vibrator when frequency adjustment is carried out by lazer evaporation.

FIG. 5 shows schematically the distribution of the component metals in the direction of thickness of an electrode. As shown in FIG. 5, the chromium layer 3a decreases and the diffusion layer 3c gradually increases and finally the gold layer 3b increases in the direction of thickness of the electrode.

As the temperature rises, the diffusion layer 3c increases and finally the base metal precipitates on the surface of the gold layer 3b. Even if the base metal is other than chromium the same phenomenon may appear.

Figure 6:
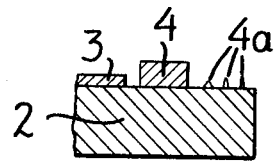

When for frequency adjustment, a portion of the metal weight 4 is evaporated by a laser beam, small bits or grains of metal 4a are apt to condense on a surface of the vibrator 2 as shown schematically in FIG. 6. If such bits of metal are subsequently dislodged by mechanical shock, the resonant frequency of the vibrator will shift. To avoid this defect, the vibrators are kept in high vacuum at high temperature after the frequency adjustment process is completed. The bits of metal 4a are thereby strongly fixed to the surface of the vibrator and will not be dislodged by shock. Any shift in the resonant frequency is thereby avoided.

According to the invention, a vibrator having film electrodes and film weights thereon is kept in a high vacuum at a high temperature after or before frequency adjustment. As a result, since distortion resulting from the etching process and from deposition of the electrodes and the film weights is eliminated, equivalent resistance of the vibrator is decreased. Moreover, since grains of metal condensed on a surface of the vibrator by the laser beam treatment are tightly affixed to the surface of the vibrator by the high vacuum, high temperature treatment, resonant frequency of the vibrator does not shift.

For the reasons stated above, it will be recognized by those skilled in the art that the process in accordance with the present invention is particularly suitable for the production of small size, low power consumption and constant frequency piezoelectro vibrators for use in electronic watches.

While a preferred embodiment of the invention has been illustrated in the drawings and is herein particularly described, it will be understood by those skilled in the art that modifications may be made and hence the invention is in no way limited to the illustrated embodiment.

What I claim is:

1. A method of making a piezoelectric vibrator which comprises shaping a vibrator from a quartz crystal wafer by photo-etching technique, applying film electrodes and masses for frequency adjustment by depositing a layer of chromium and an overlying layer of gold on said vibrator and keeping said vibrator with said deposits thereon in a high vacuum and high temperature environment for a predetermined time sufficient to eliminate distortions caused by said photo-etching and metal deposition.

2. A method according to claim 1, in which the vacuum is at least $10^{-5}$ Torr and the temperature is of the order of 300° C.

3. A method according to claim 1, in which the time during which said vibrator is kept in a high vacuum and high temperature is sufficient to produce mutual diffusion between said gold and chromium layers.

4. A method according to claim 1, further comprising the step of removing a portion of said masses with a laser beam to adjust the frequency of the vibrator and thereafter keeping said vibrator in a high vacuum and high temperature environment to affix securely to the vibrator any bits of metal that condense on the vibrator surface during said removing step.

* * * * *